(12) United States Patent
Ye et al.

(10) Patent No.: US 10,461,280 B2
(45) Date of Patent: Oct. 29, 2019

(54) DOUBLE-SIDED ELECTROLUMINESCENT DISPLAY PANEL AND DISPLAY DEVICE

(71) Applicants: BOE Technology Group Co., Ltd., Beijing (CN); Hefei Xinsheng Optoelectronics Technology Co., Ltd., Hefei (CN)

(72) Inventors: Zhijie Ye, Beijing (CN); Yue Hu, Beijing (CN); Rui Peng, Beijing (CN); Jun Wang, Beijing (CN); Kai Xu, Beijing (CN); Lei Huang, Beijing (CN); Wenbin Jia, Beijing (CN); Xinxin Wang, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/736,551

(22) PCT Filed: Jun. 28, 2017

(86) PCT No.: PCT/CN2017/090520
§ 371 (c)(1),
(2) Date: Dec. 14, 2017

(87) PCT Pub. No.: WO2018/024051
PCT Pub. Date: Feb. 8, 2018

(65) Prior Publication Data
US 2018/0358583 A1 Dec. 13, 2018

(30) Foreign Application Priority Data
Aug. 5, 2016 (CN) .......................... 2016 1 0641047

(51) Int. Cl.
*H01L 51/52* (2006.01)
*G02B 5/30* (2006.01)

(52) U.S. Cl.
CPC ...... *H01L 51/5284* (2013.01); *H01L 51/5281* (2013.01); *G02B 5/3025* (2013.01); *G02B 5/3058* (2013.01); *H01L 2251/5323* (2013.01)

(58) Field of Classification Search
None
See application file for complete search history.

(56) References Cited

U.S. PATENT DOCUMENTS 7,301,171 B2 * 11/2007 Osame ............... H01L 25/048
257/257
2004/0109112 A1 6/2004 Yamauchi et al.
(Continued)

FOREIGN PATENT DOCUMENTS

CN 1261444 A 7/2000
CN 1495485 A 5/2004
(Continued)

OTHER PUBLICATIONS

Sep. 22, 2017—(WO) International Search Report and Written Opinion Appn PCT/CN2017/090520 with English Tran.

*Primary Examiner* — Fernando L Toledo
*Assistant Examiner* — Valerie N Newton

(57) ABSTRACT

A double-sided electroluminescent display panel and a display device are provided. The double-sided electroluminescent display panel includes: a first absorption polarization structure disposed on a first light-emitting surface of a transparent electroluminescent (EL) structure, and a first reflective polarization structure disposed on a second light-emitting surface of the transparent EL structure; wherein transmission axes of the first absorption polarization structure and the first reflective polarization structure are perpendicular to each other; the first absorption polarization struc- (Continued)

ture is configured to absorb light of a first wave component and transmit light of a second wave component; the first reflective polarization structure is configured to transmit the light of the first wave component and reflect the light of the second wave component.

20 Claims, 6 Drawing Sheets

(56) References Cited

U.S. PATENT DOCUMENTS

| | | | | |
|---|---|---|---|---|
| 2006/0033865 | A1* | 2/2006 | Tanaka | G02F 1/13471 |
| | | | | 349/113 |
| 2008/0252823 | A1* | 10/2008 | Hwang | G02B 6/0038 |
| | | | | 349/96 |
| 2015/0236082 | A1 | 8/2015 | Wang et al. | |

FOREIGN PATENT DOCUMENTS

| | | |
|---|---|---|
| CN | 102593149 A | 7/2012 |
| CN | 103886813 A | 6/2014 |
| CN | 103904096 A | 7/2014 |
| CN | 103969871 A | 8/2014 |
| CN | 104377231 A | 2/2015 |
| CN | 106024848 A | 10/2016 |
| CN | 205900546 U | 1/2017 |
| EP | 0996025 B1 | 4/2006 |
| JP | 2000193956 A | 7/2000 |

\* cited by examiner

DOUBLE-SIDED ELECTROLUMINESCENT DISPLAY PANEL AND DISPLAY DEVICE

The application is a U.S. National Phase Entry of International Application No. PCT/CN2017/090520 filed on Jun. 28, 2017, designating the United States of America and claiming priority to Chinese Patent Application No. 201610641047.5 filed Aug. 5, 2016. The present application claims priority to and the benefit of the above-identified applications and the above-identified applications are incorporated by reference herein in their entirety.

TECHNICAL FIELD

The present disclosure relates to a double-sided electroluminescent display panel and a display device.

BACKGROUND

Currently, Organic Light-emitting Diode (OLED) display devices have attracted attentions of the industry because of application advantages such as self-luminescence, no backlight module, light weight, thin thickness, simple structure and durability.

OLED devices have two types, i.e., a non-transparent type and a transparent type. Non-transparent OLED devices may only emit light on one side, therefore, in a case of preparing double-sided OLED display device, two independent display devices are required to be bonded, or substrates provided with OLED devices are required to be sealed respectively. Therefore, the cost of manufacturing a double-sided OLED display device by using non-transparent OLED devices is higher, and the thickness of the double-sided OLED display device is thicker. A transparent OLED device is capable of emitting light from double sides. A double-sided OLED display panel requires an anode and a cathode of an electroluminescent (EL) device have a higher transmittance. The anode is generally made of indium tin oxide (ITO), and the cathode may be made of indium zinc oxide (IZO) or Mg/Ag (9:1 thickness). EL devices emit light in both directions due to their self-luminescence properties, thereby realizing double-sided display of OLED devices. However, because the EL devices are transparent, environmental light may also pass through the OLED panel and exits together with self-emitted light of the EL devices; as a result, contrast of the OLED device is greatly reduced and use's viewing effect is influenced greatly by the environmental light.

Therefore, how to improve the contrast of double-sided OLED display device is a technical problem to be solved by a person having ordinary skill in the art.

SUMMARY

At least one embodiment of the present disclosure provides a double-sided electroluminescent, which comprises a double-sided light-emitting transparent electroluminescent structure, a first absorption polarization structure disposed on a first light-emitting surface of the transparent electroluminescent structure, and a first reflective polarization structure disposed on a second light-emitting surface of the transparent electroluminescent structure; and transmission axes of the first absorption polarization structure and the first reflective polarization structure are perpendicular to each other; the first absorption polarization structure is configured to absorb light of a first wave component and transmit light of a second wave component; the first reflective polarization structure is configured to transmit the light of the first wave component and reflect the light of the second wave component.

In some examples, in the above double-sided electroluminescent display panel provided by an embodiment of the present disclosure, which further comprises a second reflective polarization structure disposed between the first absorption polarization structure and the transparent electroluminescent structure, and a second absorption polarization structure disposed on a side of the first reflective polarization structure facing away from the transparent electroluminescent structure; and transmission axes of the second reflective polarization structure and the second absorption polarization structure are perpendicular to each other, and the transmission axes of the first absorption polarization structure and the second reflective polarization structure have a same direction; the second absorption polarization structure is configured to absorb the light of the second wave component and transmit the light of the first wave component; the second reflective polarization structure is configured to transmit the light of the second wave component and reflect the light of the first wave component.

In some examples, in the above double-sided electroluminescent display panel provided by an embodiment of the present disclosure, which further comprises a first light absorption structure disposed between the first absorption polarization structure and the first reflective polarization structure; the first light absorption structure is configured to attenuate light intensity of light passed through the first absorption structure.

In some examples, in the above double-sided electroluminescent display panel provided by an embodiment of the present disclosure, the first light absorption structure is located between the first absorption polarization structure and the second reflective polarization structure; or, the first light absorption structure is located between the second reflective polarization structure and the transparent electroluminescent structure.

In some examples, in the above double-sided electroluminescent display panel provided by an embodiment of the present disclosure, which further comprises a second light absorption structure disposed between the second reflective polarization structure and the second absorption polarization structure; the second light absorption structure is configured to attenuate light intensity of light passed through the second absorption structure.

In some examples, in the above double-sided electroluminescent display panel provided by an embodiment of the present disclosure, the second light absorption structure is located between the second absorption polarization structure and the first reflective polarization structure; or the second light absorption structure is located between the first reflective polarization structure and the transparent electroluminescent structure.

In some examples, in the above double-sided electroluminescent display panel provided by an embodiment of the present disclosure, the first wave component is a transverse wave component, the second wave component is a longitudinal wave component; or, the first wave component is a longitudinal wave, the second wave component is a transverse wave component.

In some examples, in the above double-sided electroluminescent display panel provided by an embodiment of the present disclosure, the first reflective polarization structure or the second reflective polarization structure is a metal wire grid polarizer or a reflective polarizer.

In some examples, in the above double-sided electroluminescent display panel provided by an embodiment of the present disclosure, the first absorption polarization structure or the second absorption polarization structure is a linear polarizer.

In some examples, in the above double-sided electroluminescent display panel provided by an embodiment of the present disclosure, the linear polarizer comprises a first triacetyl cellulose film, a polyvinyl alcohol film and a second triacetyl cellulose film which are laminated.

In some examples, in the above double-sided electroluminescent display panel provided by an embodiment of the present disclosure, a material of the first light absorption structure is a dye-containing organic resin material.

In some examples, in the above double-sided electroluminescent display panel provided by an embodiment of the present disclosure, a material of the second light absorption structure is a dye-containing organic resin material.

In some examples, in the above double-sided electroluminescent display panel provided by an embodiment of the present disclosure, the first absorption polarization structure is parallel to the first light-emitting surface, and the first reflective polarization structure is parallel to the second light-emitting surface.

In some examples, in the above double-sided electroluminescent display panel provided by an embodiment of the present disclosure, the first absorption polarization structure covers an entirety of the first light-emitting surface, and the first reflective polarization structure covers an entirety of the second light-emitting surface.

At least one embodiment of the present disclosure further provides a display device, which comprises the above double-sided electroluminescent display panel provided by an embodiment of the present disclosure.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

DETAILED DESCRIPTION

Figure 1:
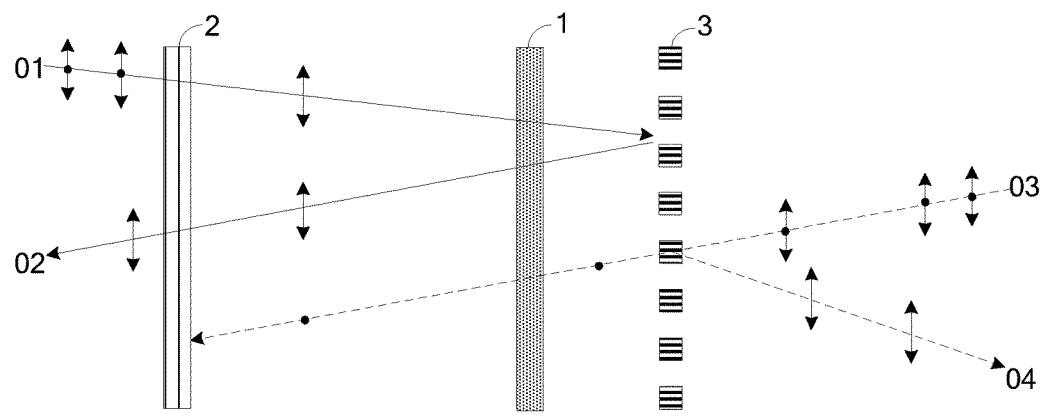
FIG. 1 is a first structural view of a double-sided electroluminescent display panel and a corresponding environmental light optical path view provided by an embodiment of the present disclosure.

In order to make objects, technical details and advantages of the embodiments of the present disclosure apparently, the technical solutions of the embodiments will be described in a clearly and fully understandable way in connection with the drawings related to the embodiments of the present disclosure. It is obvious that the described embodiments are just a part but not all of the embodiments of the present disclosure. Based on the described embodiments herein, a person having ordinary skill in the art may obtain other embodiment(s), without any inventive work, which should be within the scope of the disclosure.

The size and shape of each structure in the drawings do not reflect true proportions of the double-sided electroluminescent display panel, and are merely intended to illustrate the present disclosure.

An embodiment of the present disclosure provides a double-sided electroluminescent display panel, which comprises a double-sided light-emitting transparent electroluminescent (EL) structure, a first absorption polarization structure disposed on a first light-emitting surface of the transparent EL structure, and a first reflective polarization structure disposed on a second light-emitting surface of the transparent EL structure (the relationship of "on" described herein includes direct and indirect contact); and transmission axes of the first absorption polarization structure and the first reflective polarization structure are perpendicular to each other.

The first absorption polarization structure is configured to absorb light of a first wave component and transmit light of a second wave component.

The first reflective polarization structure is configured to transmit the light of the first wave component and reflect the light of the second wave component.

It should be noted that, the "light" herein includes environment light and self-emitted light of the EL structure.

In the above double-sided electroluminescent display panel provided by an embodiment of the present disclosure, the first absorption polarization structure and the second reflective polarization structure disposed in the double-sided electroluminescent display panel are capable of attenuating light intensity of the environment light in a case that ensuring high exitance of the self-emitted light of the EL structure, thereby the environment light does not pass through the entire display panel, so as to increase contrast of the double-sided electroluminescent display panel, reduce influence of the environment light on the double-sided electroluminescent display panel, and alleviate the problem of low contrast because of transparency of the EL structure in an original double-sided electroluminescent display panel.

It should be noted that, in a case that the first wave component is a transverse wave (S wave) component, the second wave component is a longitudinal wave (P wave) component; or the first wave component is a longitudinal wave (P wave) component, the second wave component is a transverse wave (S wave) component.

Figure 2:
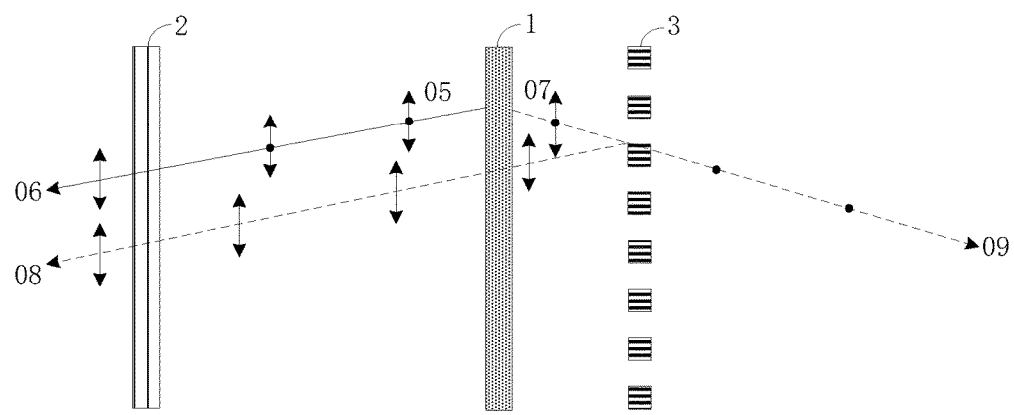
FIG. 2 is a first structural view of a double-sided electroluminescent display panel and a corresponding self-luminescence optical path view provided by an embodiment of the present disclosure.

For example, taking FIG. 1 and FIG. 2 as an example, a double-sided electroluminescent display panel provided by an embodiment of the present disclosure comprises: a double-sided light-emitting transparent EL structure 1, a first absorption polarization structure 2 disposed on a first light-emitting surface of the transparent EL structure 1, and a first reflective polarization structure 3 disposed on a second light-emitting surface of the transparent EL structure 1; transmission axes of the first absorption polarization structure 2 and the first reflective polarization structure 3 are perpendicular to each other.

As illustrated in an optical path of FIG. 1, environment light 01 (light intensity is I) incident towards the first light-emitting surface firstly passes through the first absorption polarization structure 2, because of the first absorption polarization structure 2 absorbs the environment light of the S wave component, and transmits the environment light of the P wave component, the environment light (the light intensity is I/2) of the P wave component passes through the EL structure 1, and is reflected by the first reflective polarization structure 3, and then sequentially passes through the EL structure 1 and the first absorption polarization structure 2 again and exits. At this time, emergent light in a direction from the second light-emitting surface to the first light-emitting surface includes environment light 02 (light intensity is I/2) of the P wave component.

Environment light 03 (light intensity is I) incident towards the second light-emitting surface firstly passes through the first reflective polarization structure 3, the first reflective polarization structure 3 transmits the environment light of the S wave component, and reflects the environment light of the P wave component, and then the environment light of the S wave component sequentially passes through the EL structure 1 and the first absorption polarization structure 2, because of the first absorption polarization structure 2 is capable of absorbing the environment light of the S wave component, the environment light of the S wave component does not exit; however, the environment light of the P wave component directly exits. At this time, emergent light in a direction from the first light-emitting surface to the second light-emitting surface includes the environment light 04 (light intensity is I/2) of the P wave component.

It may be seen that because of existence of the first absorption polarization structure 2 and the first reflective polarization structure 3, the environment light does not pass the entire double-sided electroluminescent display panel, and finally the light intensity of the emergent light in the direction from the first light-emitting surface to the second light-emitting surface and the light intensity of the emergent light in the direction from the second light-emitting surface to the first light-emitting surface are both I/2.

As illustrated in an optical path of FIG. 2, in the EL structure 1, self-emitted light 05 (light intensity is I) emitted from the first light-emitting surface passes through the first absorption polarization structure 2, because of the first absorption polarization structure 2 absorbs the self-emitted light of the S wave component, and transmits the self-emitted light of the P wave component, the self-emitted light of the P wave component directly exits. At this time, the emergent light in the direction from the second light-emitting surface to the first light-emitting surface includes self-emitted light 06 (light intensity is I/2) of the P wave component.

In the EL structure 1, self-emitted light 07 (light intensity is I) emitted from the second light-emitting surface passes through the first reflective polarization structure 3, because the first reflective polarization structure 3 transmits the self-emitted light of the S wave component, and reflects the self-emitted light of the P wave component, the self-emitted light of the P wave component sequentially passes through the EL structure 1 and the first absorption polarization structure 2 and exits, at this time, the emergent light in the direction from the second light-emitting surface to the first light-emitting surface includes self-luminescent 08 (light intensity is I/2) of the P wave component; however, the self-emitted light of the S wave component directly exits, at this time, the emergent light in the direction from the first light-emitting surface to the second light-emitting surface includes self-emitted light 06 (light intensity is I/2) of the S wave component.

It may be seen that because of existence of the first absorption polarization structure 2 and the first reflective polarization structure 3, the self-emitted light of the S wave component exits from one surface, and the self-emitted of the P wave component exits from another surface, and finally the light intensity of the emergent light in the direction from the first light-emitting surface to the second light-emitting surface is I/2, and the light intensity of the emergent light in the direction from the second light-emitting surface to the first light-emitting surface is I.

By comparison, emergent light intensity of the self-emitted light is still higher than that of the environment light, so that the contrast of the double-sided electroluminescent display panel may be increased.

For example, in the above double-sided electroluminescent display panel provided by an embodiment of the present disclosure, the double-sided electroluminescent display panel further comprises: a second reflective polarization structure disposed between the first absorption polarization structure and the transparent electroluminescent structure, and a second absorption polarization structure disposed on a side of the first reflective polarization structure facing away from the transparent EL structure; and transmission axes of the second reflective polarization structure and the second absorption polarization structure are perpendicular to each other. For example, a direction of a transmission axe of the first absorption polarization structure is the same as a direction of a transmission axe of the second reflective polarization structure.

The second absorption polarization structure is configured to absorb the light of the second wave component and transmit the light of the first wave component.

The second reflective polarization structure is configured to transmit the light of the second wave component and reflect the light of the first wave component.

Figure 3:
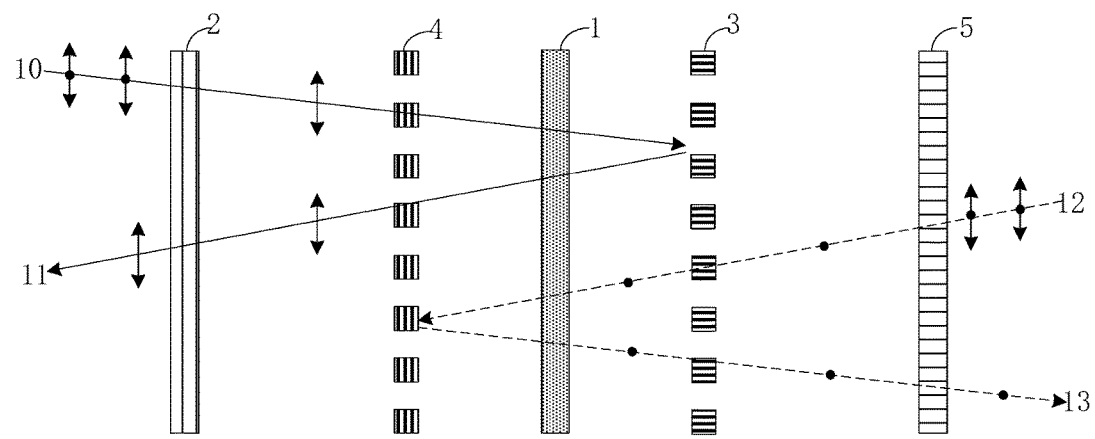
FIG. 3 is a second structural view of a double-sided electroluminescent display panel and a corresponding environmental light optical path view provided by an embodiment of the present disclosure.
Figure 4:
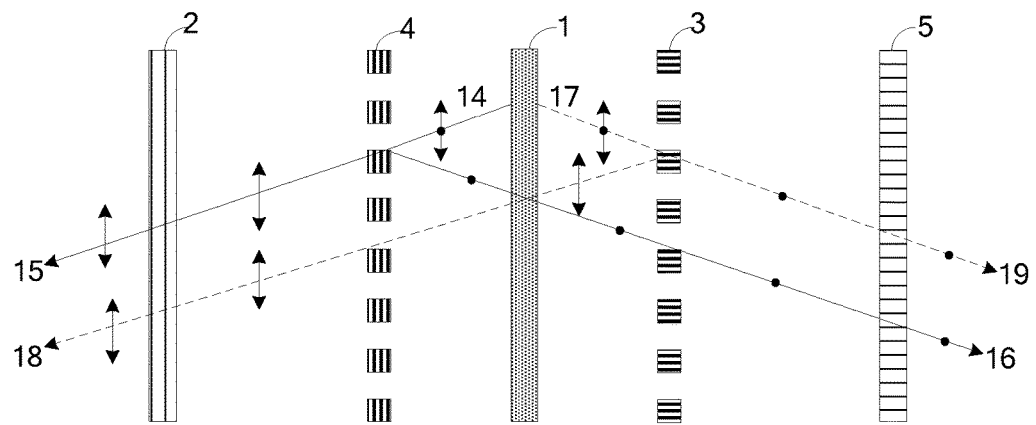
FIG. 4 is a second structural view of a double-sided electroluminescent display panel and a corresponding self-luminescence optical path view provided by an embodiment of the present disclosure.

For example, taking FIG. 3 and FIG. 4 as an example, the double-sided electroluminescent display panel provided by an embodiment of the present disclosure may further comprise: a second reflective polarization structure 4 disposed between the first absorption polarization structure 2 and the transparent electroluminescent structure 1, and a second absorption polarization structure 5 disposed on a side of the first reflective polarization structure 3 facing away from the transparent EL structure 1; and transmission axes of the second reflective polarization structure 4 and the second absorption polarization structure 5 are perpendicular to each other. For example, a direction of a transmission axe of the first absorption polarization structure 2 is the same as a direction of a transmission axe of the second reflective polarization structure 4.

As illustrated in an optical path of FIG. 3, environment light 10 (light intensity is I) incident towards the first light-emitting surface firstly passes through the first absorption polarization structure 2, because the first absorption polarization structure 2 absorbs the environment light of the S wave component, and transmits the environment light of the P wave component, the environment light (the light intensity is I/2) of the P wave component sequentially passes through the second reflective polarization structure 4 and the EL structure 1, and is reflected by the first reflective polarization structure 3, and sequentially passes through the EL structure 1, the second reflective polarization structure 4 and the first absorption polarization structure 2 again and exits. At this time, the emergent light in the direction from the second light-emitting surface to the first light-emitting surface includes environment light 11 (light intensity is I/2) of the P wave component.

Environment light 12 (light intensity is I) incident towards the second light-emitting surface firstly passes through the second absorption polarization structure 5, because the second absorption polarization structure 5 absorbs the environment light of the P wave component, and transmits the environment light of the S wave component, the environment light (the light intensity is I/2) of the S wave component sequentially passes through the first reflective polarization structure 3 and the EL structure 1, and is reflected by the second reflective polarization structure 4, and sequentially passes through the EL structure 1, the first reflective polarization structure 3 and the second absorption polarization structure 5 again and exits. At this time, the emergent light in the direction from the first light-emitting surface to the second light-emitting surface includes environment light 13 (light intensity is I/2) of the S wave component.

It may be seen that because of existence of the first absorption polarization structure 2, the first reflective polarization structure 3, the second absorption polarization structure 5 and the second reflective polarization structure 4, the environment light does not pass through the entire double-sided electroluminescent display panel, and finally the light intensity of the emergent light in the direction from the first light-emitting surface to the second light-emitting surface and the light intensity of the emergent light in the direction from the second light-emitting surface to the first light-emitting surface are both I/2.

As illustrated in an optical path of FIG. 4, in the EL structure 1, self-emitted light 14 (light intensity is I) emitted from the first light-emitting surface passes through the second reflective polarization structure 4, because of the second reflective polarization structure 4 transmits the self-emitted light of the P wave component, and reflects the self-emitted light of the S wave component, the self-emitted light of the P wave component passes through the first absorption polarization structure 2 and directly exits, at this time, the emergent light in the direction from the second light-emitting surface to the first light-emitting surface includes self-emitted light 15 (light intensity is I/2) of the P wave component; however, the self-emitted light of the S wave component sequentially passes through the EL structure 1, the first reflective polarization structure 3 and the second absorption polarization structure 5 and exits; at this time, the emergent light in the direction from the first light-emitting surface to the second light-emitting surface includes self-emitted light 16 (light intensity is I/2) of the S wave component.

In the EL structure 1, self-emitted light 17 (light intensity is I) exits from the second light-emitting surface passes through the first reflective polarization structure 3, because the first reflective polarization structure 3 transmits the self-emitted light of the S wave component, and reflects the self-emitted light of the P wave component, the self-emitted light of the S wave component passes through the second absorption polarization structure 5 and directly exits; at this time, the emergent light in the direction from the first light-emitting surface to the second light-emitting surface includes self-luminescent 19 (light intensity is I/2) of the S wave component; however, the self-emitted light of the P wave component sequentially passes through the EL structure 1, the second reflective polarization structure 4 and the first absorption polarization structure 2; at this time, the emergent light in the direction from the second light-emitting surface to the first light-emitting surface includes self-emitted light 18 (light intensity is I/2) of the P wave component.

It may be seen that because of existence of the first absorption polarization structure 2, the first reflective polarization structure 3, the second absorption polarization structure 5 and the second reflective polarization structure 4, the self-emitted light of the S wave component is emitted from one surface, and the self-emitted light of the P wave component is emitted from another surface, and finally the light intensity of the emergent light in the direction from the first light-emitting surface to the second light-emitting surface is I, and the light intensity of the emergent light in the direction from the second light-emitting surface to the first light-emitting surface is I.

By comparison, the emergent light intensity of the self-emitted light is still higher than that of the environment light, so as to attenuate intensity of the environment light in a case that ensuring high exitance of the self-emitted light of both sides of the EL structure, so that the contrast of the double-sided electroluminescent display panel can be improved, and influence of the environment light on the double-sided display panel is reduced greatly.

For example, in the above double-sided electroluminescent display panel provided by an embodiment of the present disclosure, in order to further reduce an emission rate of the environment light, the double-sided electroluminescent display panel may further comprise: a first light absorption structure disposed between the first absorption polarization structure and the first reflective polarization structure; the first light absorption structure is configured to attenuate light intensity of light passed through the first absorption structure.

Preferably, in a specific implementation, in the above double-sided electroluminescent display panel provided by an embodiment of the present disclosure, the first light absorption structure may be specifically located between the first absorption polarization structure and the second reflective polarization structure; or, the first light absorption structure may be specifically located between the second reflective polarization structure and the transparent EL structure.

Further, for example, in the above double-sided electroluminescent display panel provided by an embodiment of the present disclosure, in order to further reduce the exitance of the environment light, the double-sided electroluminescent display panel may further comprise: a second light absorption structure disposed between the second reflective polarization structure and the second absorption polarization structure; the second light absorption structure is configured to attenuate light intensity of light passed through the second absorption structure.

For example, in the above double-sided electroluminescent display panel provided by an embodiment of the present disclosure, the second light absorption structure may be located between the second absorption polarization structure and the first reflective polarization structure; or the second light absorption structure may be specifically located between the first reflective polarization structure and the transparent EL structure.

Figure 5:
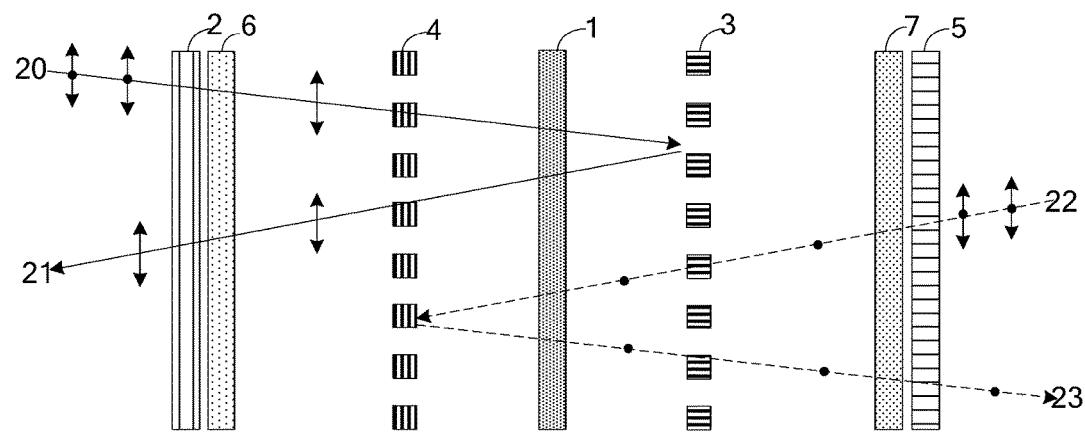
FIG. 5 is a third structural view of a double-sided electroluminescent display panel and a corresponding environmental light optical path view provided by an embodiment of the present disclosure.
Figure 6:
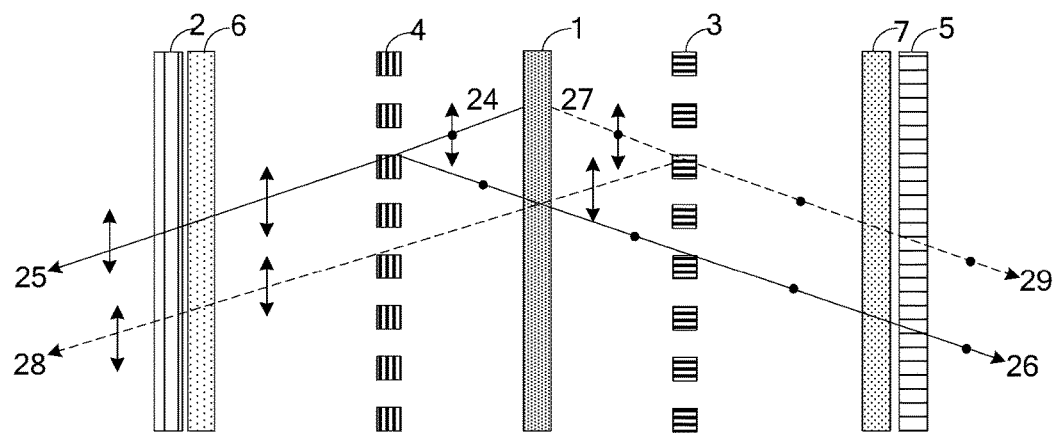
FIG. 6 is a third structural view of a double-sided electroluminescent display panel and a corresponding self-luminescence optical path view provided by an embodiment of the present disclosure.

Specifically, taking FIG. 5 and FIG. 6 as an example, in the double-sided electroluminescent display panel provided by an embodiment of the present disclosure, the first light absorption structure 6 is disposed between the first absorption polarization structure 2 and the second reflective polarization structure 4; and the second light absorption structure 7 is disposed between the first light reflective polarization structure 3 and the second absorption polarization structure 5; assuming that light transmittance of the first light absorption structure 6 and light transmittance of the second light absorption structure 7 are both T.

As illustrated in an optical path of FIG. 5, environment light 20 (light intensity is I) incident towards the first light-emitting surface first passes through the first absorption polarization structure 2, because the first absorption polarization structure 2 absorbs the environment light of the S wave component, and transmits the environment light of the P wave component, the environment light (the light intensity is I/2) of the P wave component firstly passes through the first light absorption structure 6; at this time, the light intensity of the environment light of the P wave component becomes I*T/2; and then the environment light of the P wave component sequentially passes through the second reflective polarization structure 4 and the EL structure 1, and is reflected by the first reflective polarization structure 3, and sequentially passes through the EL structure 1, the first light absorption structure 6, the second reflective polarization structure 4 and the first absorption polarization structure 2 again and exits; at this time, the emergent light in the direction from the second light-emitting surface to the first light-emitting surface includes environment light 21 (light intensity is I*T$^2$/2) of the P wave component.

Environment light 22 (light intensity is I) incident towards the second light-emitting surface firstly passes through the second absorption polarization structure 5, because the second absorption polarization structure 5 absorbs the environment light of the P wave component, and transmits the environment light of the S wave component, the environment light (the light intensity is I/2) of the S wave component firstly passes through the second light absorption structure 7; at this time, the light intensity of the environment light of the S wave component becomes I*T/2; and then the environment light of the S wave component sequentially passes through the first reflective polarization structure 3 and the EL structure 1, and is reflected by the second reflective polarization structure 4, and sequentially passes through the EL structure 1, the first reflective polarization structure 3, the second light absorption structure 7 and the second absorption polarization structure 5 again and exits; at this time, the emergent light in the direction from the first light-emitting surface to the second light-emitting surface includes environment light 23 (light intensity is I*T$^2$/2) of the S wave component.

It may be seen that because of existence of the above first absorption polarization structure 2, the first reflective polarization structure 3, the second absorption polarization structure 5, the second reflective polarization structure 4, the first light absorption structure 6 and the second light absorption structure 7, the environment light does not pass through the entire double-sided electroluminescent display panel, and finally the light intensity of the emergent light in the direction from the first light-emitting surface to the second light-emitting surface and the light intensity of the emergent light in the direction from the second light-emitting surface to the first light-emitting surface are both I*T$^2$/2. Assuming that T=0.8, both of the light intensity of the emergent light are 0.321; assuming that T=0.7, both of the light intensity of the emergent light are 0.2451, the intensity of the environment light is attenuated greatly, and a user is less susceptible to the environment light.

As illustrated in an optical path of FIG. 6, in the EL structure 1, self-emitted light 24 (light intensity is I) emitted from the first light-emitting surface passes through the second reflective polarization structure 4, because the second reflective polarization structure 4 transmits the self-emitted light of the P wave component, and reflects the self-emitted light of the S wave component, the self-emitted light of the P wave component sequentially passes through the first light absorption structure 6 and the first absorption polarization structure 2 and directly exits; at this time, the emergent light in the direction from the second light-emitting surface to the first light-emitting surface includes self-emitted light 25 (light intensity is I*T/2) of the P wave component; however, the self-emitted light of the S wave component sequentially passes through the EL structure 1, the first reflective polarization structure 3, the second light absorption structure 7 and the second absorption polarization structure 5 and exits; at this time, the emergent light in the direction from the first light-emitting surface to the second light-emitting surface includes self-emitted light 26 (light intensity is I*T/2) of the S wave component.

In the EL structure 1, self-emitted light 27 (light intensity is I) emitted from the second light-emitting passes through the first reflective polarization structure 3, because the first reflective polarization structure 3 transmits the self-emitted light of the S wave component, and reflects the self-emitted light of the P wave component, the self-emitted light of the S wave component sequentially passes through the second light absorption structure 7 and the second absorption polarization structure 5 and directly exits; at this time, the emergent light in the direction from the first light-emitting surface to the second light-emitting surface includes self-emitted light 29 (light intensity is I*T/2) of the S wave component; however, the self-emitted light of the P wave component sequentially passes through the EL structure 1, the second reflective polarization structure 4, the first light absorption structure 6 and the first absorption polarization structure 2 and exits; at this time, the emergent light in the direction from the second light-emitting surface to the first light-emitting surface includes self-emitted light 28 (light intensity is I*T/2) of the P wave component.

It may be seen that because of existence of the first absorption polarization structure 2, the first reflective polarization structure 3, the second absorption polarization structure 5, the second reflective polarization structure 4, the first light absorption structure 6 and the second light absorption structure 7, the self-emitted light of the S wave component is emitted from one surface, and the self-emitted light of the P wave component is emitted from another surface, and finally the light intensity of the emergent light in the direction from the first light-emitting surface to the second light-emitting surface and the light intensity of the emergent light in the direction from the second light-emitting surface to the first light-emitting surface are both I*T. Assuming that T=0.8, both of the light intensity of the emergent light are 0.81; assuming that T=0.7, both of the light intensity of the emergent light are 0.71.

By comparison, the emergent light intensity of the self-luminescent is still higher than that of the environment light, so as to greatly attenuate intensity of the environment light in a case that ensuring the high emissivity of the self-emitted light of both sides of the EL structure, and the environment light dose not pass through the entire double-sided electroluminescent display panel, so that the contrast of the double-sided electroluminescent display panel may be improved, and the influence of the environment light on the double-sided display panel is reduced greatly, and a low contrast problem of the original double-sided electroluminescent display panel because of transparency of the EL structure is alleviated.

Figure 7:
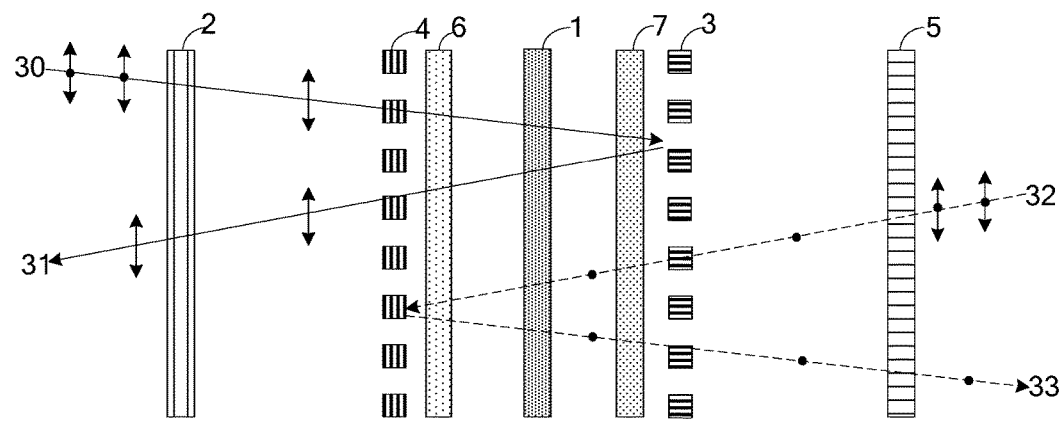
FIG. 7 is a fourth structural view of a double-sided electroluminescent display panel and a corresponding environmental light optical path view provided by an embodiment of the present disclosure.
Figure 8:
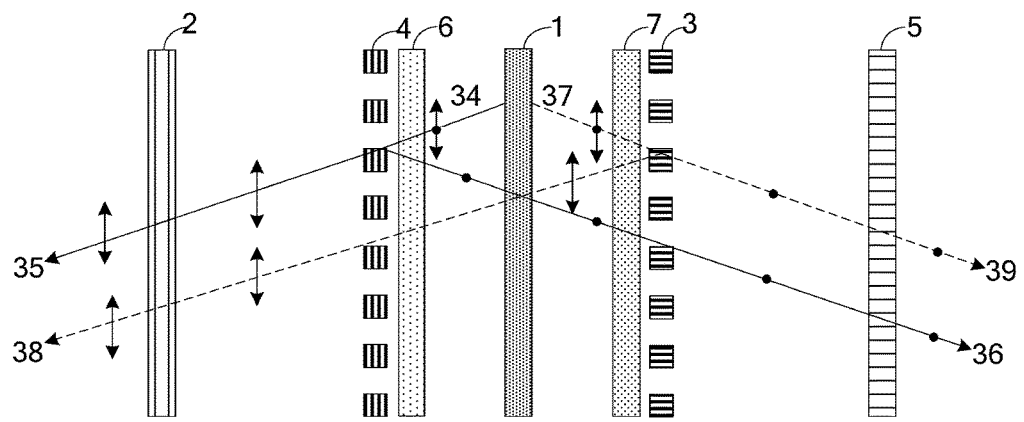
FIG. 8 is a fourth structural view of a double-sided electroluminescent display panel and a corresponding self-luminescence optical path view provided by an embodiment of the present disclosure.

In addition, for example, taking FIG. 7 and FIG. 8 as an example, in the double-sided electroluminescent display panel provided by an embodiment of the present disclosure, the first light absorption structure 6 is disposed between the second reflective polarization structure 4 and the transparent EL structure 1; and the second light absorption structure 7 is disposed between the first reflective polarization structure 3 and the transparent EL structure 1; assuming that the light transmittance of the first light absorption structure 6 and the light transmittance of the second light absorption structure 7 are both T.

As illustrated in an optical path of FIG. 7, environment light 30 (light intensity is I) incident towards the first light-emitting surface firstly passes through the first absorption polarization structure 2, because the first absorption polarization structure 2 absorbs the environment light of the S wave component, and transmits the environment light of the P wave component, the environment light (the light intensity is I/2) of the P wave component sequentially passes through the second reflective polarization structure 4 and the first light absorption structure 6; at this time the light intensity of the environment light of the P wave component becomes I*T/2; and then the environment light of the P wave component sequentially passes through the EL structure 1 and the second light absorption structure 7; at this time, the light intensity of the environment light of the P wave component becomes I*T²/2; and the environment light of the P wave component is reflected by the first reflective polarization structure 3, and sequentially passes through the second light absorption structure 7, the EL structure 1, the first light absorption structure 6, the second reflective polarization structure 4 and the first absorption polarization structure 2 again and exits. At this time, the emergent light in the direction from the second light-emitting surface to the first light-emitting surface includes environment light 31 (light intensity is I*T⁴/2) of the P wave component.

Environment light 32 (light intensity is I) incident towards the second light-emitting surface firstly passes through the second absorption polarization structure 5, because the second absorption polarization structure 5 absorbs the environment light of the P wave component, and transmits the environment light of the S wave component, the environment light (the light intensity is I/2) of the S wave component sequentially passes through the first reflective polarization structure 3 and the second light absorption structure 7; at this time, the light intensity of the environment light of the S wave component becomes I*T/2; and then the environment light of the S wave component sequentially passes through the EL structure 1 and the first light absorption structure 6; at this time, the light intensity of the environment light of the S wave component becomes I*T²/2; the environment light of the S wave component is reflected by the second reflective polarization structure 4, and sequentially passes through the first light absorption structure 6, the EL structure 1, the second light absorption structure 7, the first reflective polarization structure 3 and the second absorption polarization structure 5 again and exits; at this time, the emergent light in the direction from the first light-emitting surface to the second light-emitting surface includes environment light 33 (light intensity is I*T⁴/2) of the S wave component.

It may be seen that because of existence of the first absorption polarization structure 2, the first reflective polarization structure 3, the second absorption polarization structure 5, the second reflective polarization structure 4, the first light absorption structure 6 and the second light absorption structure 7, the environment light does not pass through the entire double-sided electroluminescent display panel, and finally the light intensity of the emergent light in the direction from the first light-emitting surface to the second light-emitting surface and the light intensity of the emergent light in the direction from the second light-emitting surface to the first light-emitting surface are both I*T⁴/2. Assuming that T=0.8, both of the light intensity of the emergent light are 0.21; assuming that T=0.7, both of the light intensity of the emergent light are 0.121, the intensity of the environment light is attenuated greatly, and a user is less susceptible to the environment light.

As illustrated in an optical path of FIG. 8, in the EL structure 1, self-emitted light 34 (light intensity is I) emitted from the first light-emitting surface sequentially passes through the first light absorption structure 6 and the second reflective polarization structure 4, because the second reflective polarization structure 4 transmits the self-emitted light of the P wave component, and reflects the self-emitted light of the S wave component, the self-emitted light of the P wave component passes through the first absorption polarization structure 2 and directly exits; at this time, the emergent light in the direction from the second light-emitting surface to the first light-emitting surface includes self-emitted light 35 (light intensity is I*T/2) of the P wave component; however, the self-emitted light of the S wave component sequentially passes through the first light absorption structure 6, the EL structure 1, the second light absorption structure 7, the first reflective polarization structure 3 and the second absorption polarization structure 5 and exits; at this time, the emergent light in the direction from the first light-emitting surface to the second light-emitting surface includes self-luminescent 36 (light intensity is I*T³/2) of the S wave component.

In the EL structure 1, self-emitted light 37 (light intensity is I) emitted from the second light-emitting sequentially passes through the second light absorption structure 7 and the first reflective polarization structure 3, because the first reflective polarization structure 3 transmits the self-emitted light of the S wave component, and reflects self-emitted light of the P wave component, the self-emitted light of the S wave component passes through the second absorption polarization structure 5 and directly exits; at this time, the emergent light in the direction from the first light-emitting surface to the second light-emitting surface includes self-emitted light 39 (light intensity is I*T/2) of the S wave component; however, the self-emitted light of the P wave component sequentially passes through the second light absorption structure 7, the EL structure 1, the first light absorption structure 6, the second reflective polarization structure 4 and the first absorption polarization structure 2 and exits; at this time, the emergent light in the direction from the second light-emitting surface to the first light-emitting surface includes self-emitted light 38 (light intensity is I*T³/2) of the P wave component.

It may be seen that because of existence of the above first absorption polarization structure 2, the first reflective polarization structure 3, the second absorption polarization structure 5, the second reflective polarization structure 4, the first light absorption structure 6 and the second light absorption structure 7, the self-emitted light of the S wave component is emitted from one surface, and the self-emitted light of the P wave component is emitted from another surface, and finally the light intensity of the emergent light in the direction from the first light-emitting surface to the second light-emitting surface and the light intensity of the emergent light in the direction from the second light-emitting surface to the first light-emitting surface are both I*(T+T³)/2. Assuming that T=0.8, both of the light intensity of the emergent light are 0.656 I; assuming that T=0.7, both of the light intensity of the emergent light are 0.5215 I.

By comparison, the emission intensity of the self-luminescent is still higher than that of the environment light, so as to greatly attenuate intensity of the environment light in a case that ensuring the high emissivity of the self-emitted light of both sides of the EL structure, and the environment light dose not pass through the entire double-sided electroluminescent display panel, so that the contrast of the double-sided electroluminescent display panel may be improved, and influence of the environment light on the double-sided display panel is reduced greatly, and a low contrast problem of the original double-sided electroluminescent display panel because of transparency of the EL structure is alleviated.

The above double-sided electroluminescent display panel provided by an embodiment of the present disclosure comprises not only the structure described above, further comprises other structures. For example, the double-sided electroluminescent display panel only has the first absorption polarization structure 2, the first reflective polarization structure 3 and the first light absorption structure 6; or, the double-sided electroluminescent display panel only has the first absorption polarization structure 2, the first reflective polarization structure 3, the first light absorption structure 6 and the second light absorption structure 7; or, the double-sided electroluminescent display panel only has the first absorption polarization structure 2, the first reflective polarization structure 3, the second absorption polarization structure 5, the second reflective polarization structure 4 and the first light absorption structure 6; or, the double-sided electroluminescent display panel only has the first absorption polarization structure 2, the first reflective polarization structure 3, the second absorption polarization structure 5, the second reflective polarization structure 4 and the second light absorption structure 7, and so on, as long as the contrast of the double-sided display panel may be increased, there is no limited herein.

In the following, taking the double-sided electroluminescent display panel only has the first absorption polarization structure 2, the first reflective polarization structure 3, the first light absorption structure 6 and the second light absorption structure 7 as an example to specifically describe the following optical path.

Figure 9:
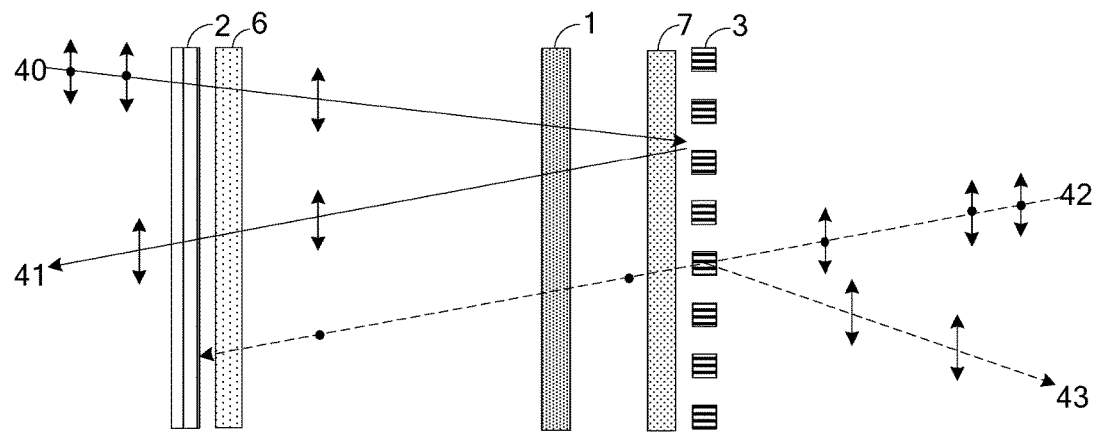
FIG. 9 is a fifth structural view of a double-sided electroluminescent display panel and a corresponding environmental light optical path view provided by an embodiment of the present disclosure.
Figure 10:
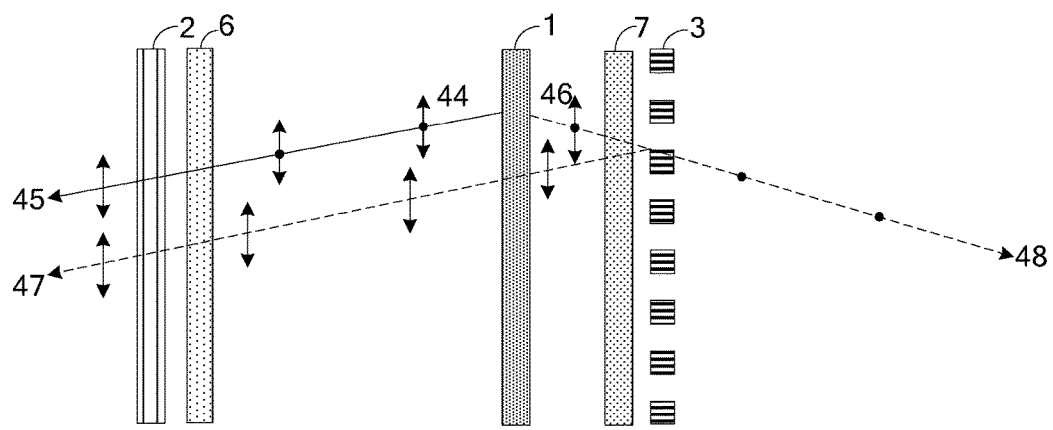
FIG. 10 is a fifth structural view of a double-sided electroluminescent display panel and a corresponding self-luminescence optical path view provided by an embodiment of the present disclosure.

For example, taking FIG. 9 and FIG. 10 as an example, in the double-sided electroluminescent display panel provided by an embodiment of the present disclosure, the first light absorption structure 6 is located between the first absorption polarization structure 2 and the EL structure 1, and the second light absorption structure 7 is located between the EL structure 1 and the first reflective polarization structure 3.

As illustrated in an optical path of FIG. 9, environment light 40 (light intensity is I) incident towards the first light-emitting surface firstly passes through the first absorption polarization structure 2, because the first absorption polarization structure 2 absorbs the environment light of the S wave component, and transmits the environment light of the P wave component, the environment light (the light intensity is I/2) of the P wave component sequentially passes through the first light absorption structure 6, the EL structure 1 and the second light absorption structure 7; at this time, the light intensity of the environment light of the P wave component becomes I*T²/2; and the environment light of the P wave component is reflected by the first reflection polarization structure 3, and sequentially passes through the second light absorption structure 7, the EL structure 1, the light absorption structure 6 and the first absorption polarization structure 2 again and exits; at this time, the emergent light in the direction from the second light-emitting surface to the first light-emitting surface includes environment light 41 (light intensity is I*T⁴/2) of the P wave component.

Environment light 42 (light intensity is I) incident towards the second light-emitting surface firstly passes through the first reflection polarization structure 3, the first reflection polarization structure 3 transmits the environment light of the S wave component, reflects the environment light of the P wave component, and then the environment light of the S wave component sequentially passes through the second light absorption structure 7, the EL structure 1, the light absorption structure 6 and the first absorption polarization structure 2. Because the first absorption polarization structure 2 is capable of absorbing the environment light of the S wave component, the environment light of the S wave component does not exit; however, the environment light of the P wave component directly exits; at this time, the emergent light in the direction from the first light-emitting surface to the second light-emitting surface includes environment light 43 (light intensity is I/2) of the P wave component.

It may be seen that because of existence of the first absorption polarization structure 2, the first light absorption structure 6, the first reflective polarization structure 3, and the second light absorption structure 7, the environment light does not passes through the entire double-sided electroluminescent display panel, and finally the light intensity of the emergent light in the direction from the first light-emitting surface to the second light-emitting surface is I/2, and the light intensity of the emergent light in the direction from the second light-emitting surface to the first light-emitting surface is I*T⁴/2.

As illustrated in an optical path of FIG. 10, in the EL structure 1, self-emitted light 44 (light intensity is I) emitted from the first light-emitting surface sequentially passes through the first light absorption structure 6 and the first absorption polarization structure 2, because the first absorption polarization structure 2 absorbs the self-emitted light of the S wave component, and transmits the self-emitted light of the P wave component, the self-emitted light of the P wave component directly exits; at this time, the emergent light in the direction from the second light-emitting surface to the first light-emitting surface includes self-emitted light 45 (light intensity is I*T/2) of the P wave component.

In the EL structure 1, self-emitted light 46 (light intensity is I) emitted from the second light-emitting sequentially passes through the second light absorption structure 7 and the first reflective polarization structure 3, because the first reflective polarization structure 3 transmits the self-emitted light of the S wave component, and reflects the self-emitted light of the P wave component, the self-emitted light of the P wave component sequentially passes through the second light absorption structure 7, the EL structure 1, the first light absorption structure 6 and the first absorption polarization structure 2 and exits; at this time, the emergent light in the direction from the second light-emitting surface to the first light-emitting surface includes self-emitted light 47 (light intensity is I*T$^3$/2) of the P wave component; however, the self-emitted light of the S wave component directly exits; at this time, the emergent light in the direction from the first light-emitting surface to the second light-emitting surface includes self-emitted light 48 (light intensity is I*T/2) of the S wave component.

It may be seen that because of existence of the first absorption polarization structure 2, the first light absorption structure 6, the first reflective polarization structure 3 and the second light absorption structure 7, the self-emitted light of the S wave component is emitted from one surface, and the self-emitted light of the P wave component is emitted from another surface, and finally the light intensity of the emergent light in the direction from the first light-emitting surface to the second light-emitting surface is I*T/2, and the light intensity of the emergent light in the direction from the second light-emitting surface to the first light-emitting surface is I*(T$^3$+T)/2.

By comparison, the emergent light intensity of the self-emitted light is still higher than that of the environment light, especially that the intensity of the emergent light in the direction from the second light-emitting surface to the first light-emitting surface is higher; therefore, the contrast of the double-sided electroluminescent display panel may be improved.

Figure 11:
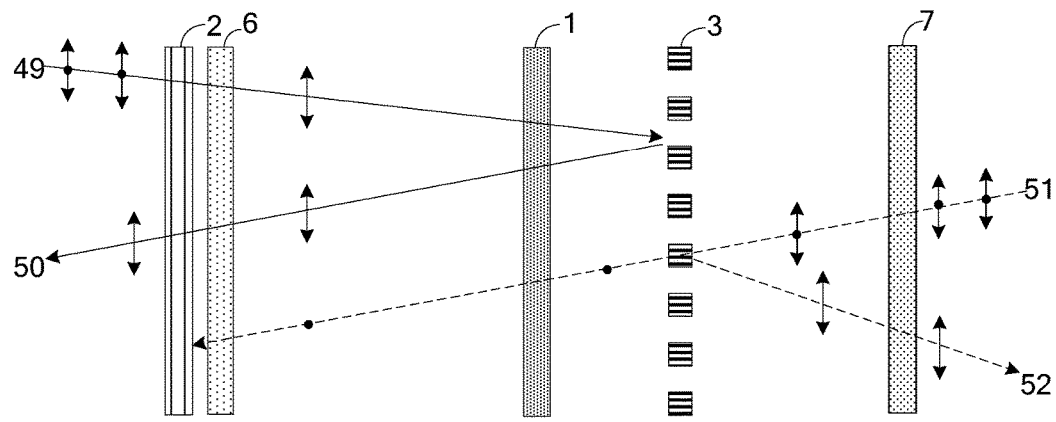
FIG. 11 is a sixth structural view of a double-sided electroluminescent display panel and a corresponding environmental light optical path view provided by an embodiment of the present disclosure.
Figure 12:
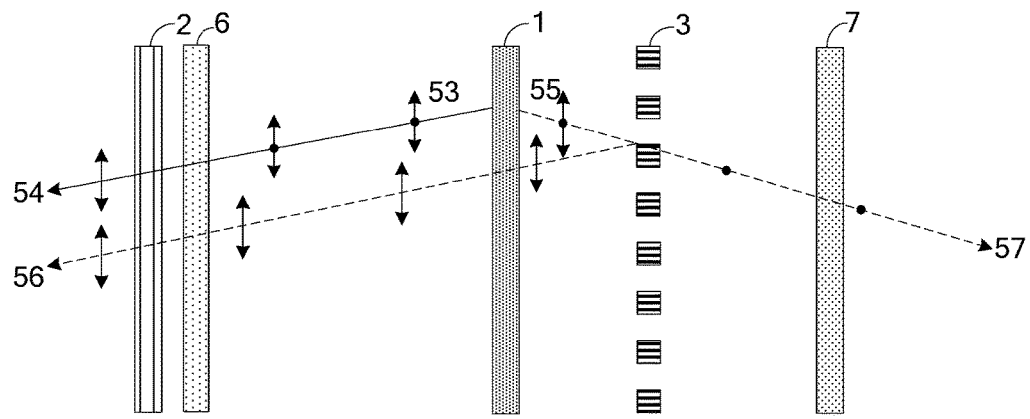
FIG. 12 is a sixth structural view of a double-sided electroluminescent display panel and a corresponding self-luminescence optical path view provided by an embodiment of the present disclosure.

In addition, taking FIG. 11 and FIG. 12 as an example, in the double-sided electroluminescent display panel provided by an embodiment of the present disclosure, the first light absorption structure 6 is located between the first absorption polarization structure 2 and the EL structure 1, the second light absorption structure 7 is located on a side of the first reflective polarization structure 3 facing away from the EL structure 1.

As illustrated in an optical path of FIG. 11, environment light 49 (light intensity is I) incident towards the first light-emitting surface firstly passes through the first absorption polarization structure 2, because the first absorption polarization structure 2 absorbs the environment light of the S wave component, and transmits the environment light of the P wave component, the environment light (the light intensity is I/2) of the P wave component sequentially passes through the first light absorption structure 6 and the EL structure 1; at this time, the light intensity of the environment light of the P wave component becomes I*T/2; and the environment light of the P wave component is reflected by the first reflective polarization structure 3, and sequentially passes through the EL structure 1, the first light absorption structure 6 and the first absorption polarization structure 2 again and exits; at this time, the emergent light in the direction from the second light-emitting surface to the first light-emitting surface includes environment light 50 (light intensity is I*T$^2$/2) of the P wave component.

Environment light 51 (light intensity is I) incident towards the second light-emitting surface sequentially passes through the second light absorption structure 7 and the first reflective polarization structure 3, the first reflective polarization structure 3 transmits the environment light of the S wave component, and reflects the environment light of the P wave component, and then the environment light of the S wave component sequentially passes through the EL structure 1, the first light absorption structure 6 and the first absorption polarization structure 2, because the first absorption polarization structure 2 may absorb the environment light of the S wave component, the environment light of the S wave component does not exit; however, the environment light of the P wave component passes through the second light absorption structure 7 and directly exits; at this time, the emergent light in the direction from the first light-emitting surface to the second light-emitting surface includes self-luminescent 52 (light intensity is I*T$^2$/2) of the P wave component.

It may be seen that because of existence of the above first absorption polarization structure 2, the first light absorption structure 6, the first reflective polarization structure 3, and the second light absorption structure 7, the environment light does not pass through the entire double-sided electroluminescent display panel, and finally the light intensity of the emergent light in the direction from the first light-emitting surface to the second light-emitting surface and the light intensity of the emergent light in the direction from the second light-emitting surface to the first light-emitting surface are both I*T$^2$/2.

As illustrated in an optical path of FIG. 12, in the EL structure 1, self-emitted light 53 (light intensity is I) emitted from the first light-emitting surface sequentially passes through the first light absorption structure 6 and the first absorption polarization structure 2, because the first absorption polarization structure 2 absorbs the environment light of the S wave component, and transmits the self-emitted light of the P wave component, the self-emitted light of the P wave component directly exits; at this time, the emergent light in the direction from the second light-emitting surface to the first light-emitting surface includes self-emitted light 54 (light intensity is I*T/2) of the P wave component.

In the EL structure 1, self-emitted light 55 (light intensity is I) emitted from the second light-emitting passes through the first reflective polarization structure 3, because the first reflective polarization structure 3 transmits the self-emitted light of the S wave component, and reflects the self-emitted light of the P wave component, the self-emitted light of the P wave component sequentially passes through the EL structure 1, the first light absorption structure 6 and the first absorption polarization structure 2 and exits; at this time, the emergent light in the direction from the second light-emitting surface to the first light-emitting surface includes self-luminescent 56 (light intensity is I*T/2) of the P wave component; however, the self-emitted light of the S wave component passes through the second light absorption structure 7 and directly exits; at this time, the emergent light in the direction from the first light-emitting surface to the second light-emitting surface includes self-emitted light 57 (light intensity is I*T/2) of the S wave component.

It may be seen that because of existence of the above first absorption polarization structure 2, the first light absorption structure 6, the first reflective polarization structure 3 and the second light absorption structure 7, the self-emitted light of the S wave component is emitted from one surface, and the self-emitted light of the P wave component is emitted from another surface, and finally the light intensity of the emergent light in the direction from the first light-emitting surface to the second light-emitting surface is I*T/2, and the light intensity of the emergent light in the direction from the second light-emitting surface to the first light-emitting surface is I*T.

By comparison, the emission intensity of the self-emitted light is still higher than that of the environment light; therefore, the contrast of the double-sided electroluminescent display panel may be improved.

For example, in the above double-sided electroluminescent display panel provided by an embodiment of the present disclosure, the first reflective polarization structure or the second reflective polarization structure may be a metal wire grid polarizer or a reflective polarizer. The reflective polarizer may select 3M reflective polarizer DBEF. The selection of the first reflective polarization structure and the second reflective polarization structure may be based in an actual situation, which is not limited herein.

For example, in the above double-sided electroluminescent display panel provided by an embodiment of the present disclosure, the first absorption polarization structure or the second absorption polarization is a linear polarizer. The linear polarizer may specially comprise a first triacetyl cellulose (TAC) film, a polyvinyl alcohol (PVA) film and a second triacetyl cellulose (TAC) film which are laminated, that is, the linear polarizer is obtained by laminating a TAC protective film on an upper surface and a lower surface on the PVA film. The selection of the first absorption polarization structure and the second absorption polarization structure may be based in an actual situation, which is not limited herein.

For example, in the above double-sided electroluminescent display panel provided by an embodiment of the present disclosure, a material of the first light absorption structure may be a dye-containing organic resin material; a material of the second light absorption structure may also be a dye-containing organic resin material; the dye may act as a light absorber. The selection of the first light absorption structure and the second light absorption structure may be based in an actual situation, which is not limited herein.

For example, the double-sided electroluminescent display panel provided by an embodiment of the present disclosure can further comprises other film structures such as a light-emitting layer, a cathode and an anode, and a base substrate can be formed with a thin film transistor, a gate line, a data line and other structures, the specific structures may be implemented by a plurality of manners, which are not limited herein.

For example, in the above double-sided electroluminescent display panel provided by an embodiment of the present disclosure, each absorption polarization structure, each reflective polarization structure and each light absorption structure may be disposed to be parallel to the first light-emitting surface or the second light-emitting surface.

For example, in the above double-sided electroluminescent display panel provided by an embodiment of the present disclosure, each absorption polarization structure, each reflective polarization structure and each light absorption structure may cover an entirety of the corresponding first light-emitting surface and an entirety of the corresponding second light-emitting surface.

Based on the same inventive concept, an embodiment of the present disclosure further provides a display device, which comprises the above double-sided electroluminescent display panel provided by at least one embodiment of the present disclosure, the display device may be any product or component having a display function, such as a mobile phone, a tablet computer, a television, a display, a notebook computer, a digital photo frame, a navigator, and the like. Other indispensable components of the display device should be understood by a person having ordinary skill in the art, and are not be described in detail herein again, and should not be a limitation of the present disclosure. The implementation of the display device may refer to the above embodiments of the double-sided electroluminescent display panel, and the details are not repeated herein again.

An embodiment of the present disclosure provides a double-sided electroluminescent display panel and a display device, which comprises a double-sided light-emitting transparent electroluminescent structure, a first absorption polarization structure disposed on a first light-emitting surface of the transparent electroluminescent structure, and a first reflective polarization structure disposed on a second light-emitting surface of the transparent electroluminescent structure; and transmission axes of the first absorption polarization structure and the first reflective polarization structure are perpendicular to each other; the first absorption polarization structure is configured to absorb light of a first wave component and transmit light of a second wave component; the first reflective polarization structure is configured to transmit the light of the first wave component and reflect the light of the second wave component. By combined actions of the first absorption polarization structure and the first reflection polarization structure provided in the double-sided electroluminescent display panel, the intensity of the environment light may be greatly attenuated in a case that ensuring the high exitance of the self-emitted light of both sides of the EL structure, and the environment light dose not pass through the entire double-sided electroluminescent display panel, so that the contrast of the double-sided electroluminescent display panel may be improved, and influence of the environment light on the double-sided display panel is reduced greatly, and a low contrast problem of an original double-sided electroluminescent display panel because of transparency of the EL structure is alleviated.

The above are only specific implementations of the present disclosure, and the scope of the present disclosure is not limited thereto, the scope of the present disclosure should be based on the scope of the claims.

The present application claims priority to the Chinese patent application No. 201610641047.5 filed Aug. 5, 2016, the entire disclosure of which is incorporated herein by reference as part of the present application.

What is claimed is:

1. A double-sided electroluminescent display panel, comprising:

a double-sided light-emitting transparent electroluminescent structure;

a first absorption polarization structure disposed on a first light-emitting surface of the transparent electroluminescent structure; and a first reflective polarization structure disposed on a second light-emitting surface of the transparent electroluminescent structure, wherein transmission axes of the first absorption polarization structure and the first reflective polarization structure are perpendicular to each other, the first absorption polarization structure is configured to absorb light of a first wave component and transmit light of a second wave component, and the first reflective polarization structure is configured to transmit the light of the first wave component and reflect the light of the second wave component.

2. The double-sided electroluminescent display panel according to claim 1, further comprising:
a second reflective polarization structure disposed between the first absorption polarization structure and the transparent electroluminescent structure; and
a second absorption polarization structure disposed on a side of the first reflective polarization structure facing away from the transparent electroluminescent structure, wherein transmission axes of the second reflective polarization structure and the second absorption polarization structure are perpendicular to each other, the transmission axes of the first absorption polarization structure and the second reflective polarization structure have a same direction, the second absorption polarization structure is configured to absorb the light of the second wave component and transmit the light of the first wave component, and the second reflective polarization structure is configured to transmit the light of the second wave component and reflect the light of the first wave component.

3. The double-sided electroluminescent display panel according to claim 2, further comprising: a first light absorption structure disposed between the first absorption polarization structure and the first reflective polarization structure,
wherein the first light absorption structure is configured to attenuate light intensity of light passed through the first light absorption structure.

4. The double-sided electroluminescent display panel according to claim 3, wherein the first light absorption structure is located between the first absorption polarization structure and the second reflective polarization structure; or,
the first light absorption structure is located between the second reflective polarization structure and the transparent electroluminescent structure.

5. The double-sided electroluminescent display panel according to claim 2, further comprising: a second light absorption structure disposed between the second reflective polarization structure and the second absorption polarization structure,
wherein the second light absorption structure is configured to attenuate light intensity of light passed through the second light absorption structure.

6. The double-sided electroluminescent display panel according to claim 5, wherein the second light absorption structure is located between the second absorption polarization structure and the first reflective polarization structure; or
the second light absorption structure is located between the first reflective polarization structure and the transparent electroluminescent structure.

7. The double-sided electroluminescent display panel according to claim 1, wherein the first wave component is a transverse wave component and the second wave component is a longitudinal wave component; or, the first wave component is a longitudinal wave component and the second wave component is a transverse wave component.

8. The double-sided electroluminescent display panel according to claim 2, wherein the first reflective polarization structure or the second reflective polarization structure is a metal wire grid polarizer or a reflective polarizer.

9. The double-sided electroluminescent display panel according to claim 2, wherein the first absorption polarization structure or the second absorption polarization structure is a linear polarizer.

10. The double-sided electroluminescent display panel according to claim 9, wherein the linear polarizer comprises a first triacetyl cellulose film, a polyvinyl alcohol film, and a second triacetyl cellulose film which are laminated.

11. The double-sided electroluminescent display panel according to claim 3, wherein a material of the first light absorption structure is a dye-containing organic resin material.

12. The double-sided electroluminescent display panel according to claim 5, wherein a material of the second light absorption structure is a dye-containing organic resin material.

13. The double-sided electroluminescent display panel according to claim 1, wherein the first absorption polarization structure is parallel to the first light-emitting surface, and the first reflective polarization structure is parallel to the second light-emitting surface.

14. The double-sided electroluminescent display panel according to claim 1, wherein the first absorption polarization structure covers an entirety of the first light-emitting surface, and the first reflective polarization structure covers an entirety of the second light-emitting surface.

15. A display device, comprising the double-sided electroluminescent display panel according to claim 1.

16. The display device according to claim 15, further comprising:
a second reflective polarization structure disposed between the first absorption polarization structure and the transparent electroluminescent structure; and
a second absorption polarization structure disposed on a side of the first reflective polarization structure facing away from the transparent electroluminescent structure, wherein transmission axes of the second reflective polarization structure and the second absorption polarization structure are perpendicular to each other, the transmission axes of the first absorption polarization structure and the second reflective polarization structure have a same direction, the second absorption polarization structure is configured to absorb the light of the second wave component and transmit the light of the first wave component, and the second reflective polarization structure is configured to transmit the light of the second wave component and reflect the light of the first wave component.

17. The display device according to claim 16, further comprising: a first light absorption structure disposed between the first absorption polarization structure and the first reflective polarization structure,
wherein the first light absorption structure is configured to attenuate light intensity of light passed through the first light absorption structure.

18. The display device according to claim 17, wherein the first light absorption structure is located between the first absorption polarization structure and the second reflective polarization structure; or,
the first light absorption structure is located between the second reflective polarization structure and the transparent electroluminescent structure.

19. The display device according to claim 16, further comprising: a second light absorption structure disposed between the second reflective polarization structure and the second absorption polarization structure,
wherein the second light absorption structure is configured to attenuate light intensity of light passed through the second light absorption structure.

20. The display device according to claim 19, wherein the second light absorption structure is located between the second absorption polarization structure and the first reflective polarization structure; or the second light absorption structure is located between the first reflective polarization structure and the transparent electroluminescent structure.

* * * * *